United States Patent
Yebka et al.

(10) Patent No.: US 12,048,121 B2
(45) Date of Patent: Jul. 23, 2024

(54) THERMALLY CONDUCTIVE COMPOSITIONS FOR TARGETED HEAT DISSIPATION OF ELECTRONIC COMPONENTS

(71) Applicant: Lenovo (Singapore) PTE. LTD., New Tech Park (SG)

(72) Inventors: Bouziane Yebka, Apex, NC (US); Tin-Lup Wong, Chapel Hill, NC (US); Philip J. Jakes, Durham, NC (US)

(73) Assignee: Lenovo (Singapore) Pte. Ltd., New Tech Park (SG)

( * ) Notice: Subject to any disclaimer, the term of this patent is extended or adjusted under 35 U.S.C. 154(b) by 271 days.

(21) Appl. No.: 17/404,766

(22) Filed: Aug. 17, 2021

(65) Prior Publication Data

US 2023/0057644 A1 Feb. 23, 2023

(51) Int. Cl.
*H05K 7/20* (2006.01)
*C09K 5/12* (2006.01)
*C09K 5/14* (2006.01)
*H01L 23/373* (2006.01)
*C09K 5/00* (2006.01)

(52) U.S. Cl.
CPC .............. *H05K 7/2039* (2013.01); *C09K 5/12* (2013.01); *C09K 5/14* (2013.01); *C09K 5/00* (2013.01); *H01L 23/3737* (2013.01)

(58) Field of Classification Search
CPC .............. H05K 7/2039; H05K 7/20481; H01L 23/3737; C09K 5/00; C09K 5/14; C09K 5/12
See application file for complete search history.

(56) References Cited

U.S. PATENT DOCUMENTS

| | | | | |
|---|---|---|---|---|
| 2002/0090501 | A1* | 7/2002 | Tobita | D01F 9/15 428/297.4 |
| 2005/0256241 | A1* | 11/2005 | Sachdev | H01L 23/433 257/E23.09 |
| 2009/0117345 | A1* | 5/2009 | Strader | H01L 23/433 156/289 |
| 2012/0182693 | A1* | 7/2012 | Boday | H01L 23/3737 252/78.3 |
| 2015/0130045 | A1* | 5/2015 | Tseng | H01L 25/0652 438/122 |
| 2015/0376488 | A1* | 12/2015 | Tan | C08L 83/14 252/78.3 |
| 2016/0325278 | A1* | 11/2016 | Takagi | B01L 3/502707 |

* cited by examiner

*Primary Examiner* — Adam B Dravininkas
(74) *Attorney, Agent, or Firm* — Kunzler Bean & Adamson

(57) ABSTRACT

Thermal spreaders for targeted heat dissipation of an electronic component are disclosed. One thermal spreader includes a thermally conductive composition configured to function in conjunction with an electrically insulator material to dissipate heat away from a heat-generating electronic component of a computing device while electrically insulating the electronic component. The thermally conductive composition is malleable to target placement of the thermally conductive material on the electrically insulator material such that the thermally conductive composition is in thermal communication with a targeted area of the electronic component over which the electrically insulator material is positioned for targeted heat dissipation of the electronic component. Apparatus and systems including one or more of the thermal spreaders for targeted heat dissipation of one or more electronic components included therein are also disclosed.

20 Claims, 12 Drawing Sheets

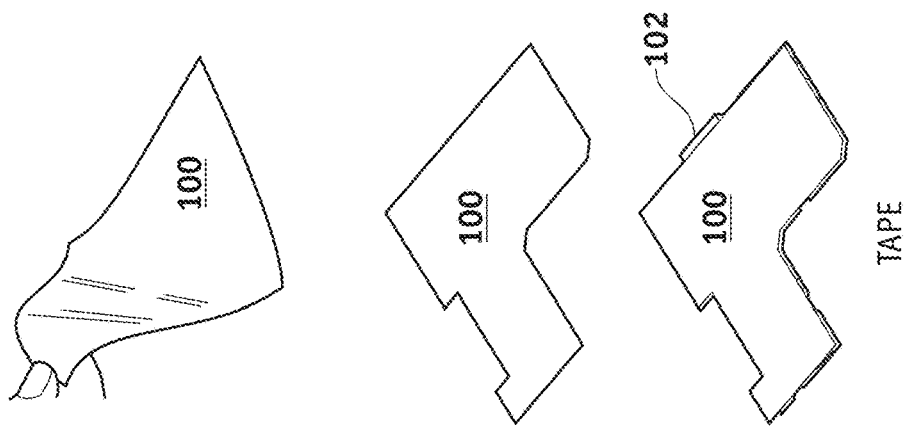
FIG. 1C TAPE
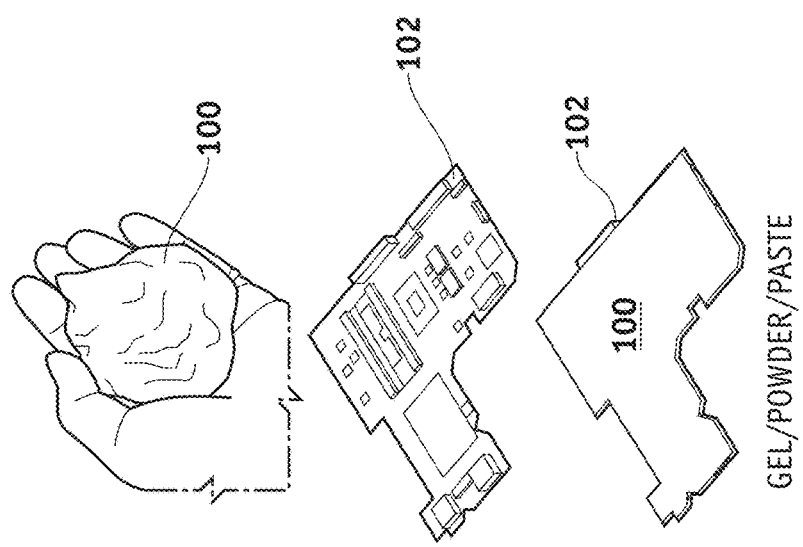
FIG. 1B GEL/POWDER/PASTE
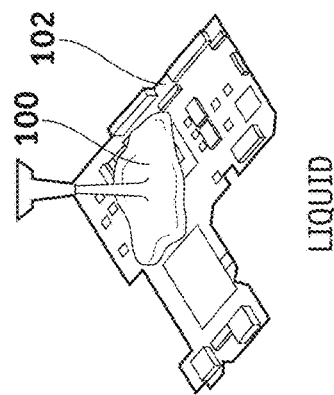
FIG. 1A LIQUID

TABLE 1

| Thermal Composition# | Polysiloxane | Talc | Thermal Conductive Material(s) | Additives | | Wax |
|---|---|---|---|---|---|---|
| | | | | Methyltris Silane | 3-aminopropyl Triethoxysilane | |
| 100-11 | 25 % | 35 % | 35 % | (1-3%) ⇧ | ⇩ (1-3%) | 2 % |
| 100-12 | 45 % | 25 % | 25 % | (1-3%) ⇧ | ⇩ (1-3%) | 2 % |
| 100-13 | 55 % | 25 % | 15 % | (1-3%) ⇧ | ⇩ (1-3%) | 2 % |
| 100-14 | 65 % | 20 % | 5 % | (1-3%) ⇧ | ⇩ (1-3%) | 2 % |
| Range | 5% to 95% | 5% to 95% | 1% to 95% | 0.5% to 10% | 0.5% to 10% | 0% to 5% |

FIG. 2

TABLE 2

| Temperature | 0°C | 25°C | 35°C | 40°C | 55°C |
|---|---|---|---|---|---|
| Thermo-conductivity (W/mK) | 6.3 | 9.5 | 11.2 | 11.5 | 15.2 |
| Resistivity (Ω) | >10$^{13}$ | >10$^{13}$ | >10$^{13}$ | >10$^{13}$ | >10$^{13}$ |

FIG. 3

TABLE 3

| Thermal Composition# | Rubber | Talc Silica | Thermal Conductive Material(s) | Wax |
|---|---|---|---|---|
| 100-21 | 35 % | 5 % | 45 % | 15 % |
| 100-22 | 45 % | 5 % | 35 % | 15 % |
| 100-23 | 55 % | 5 % | 25 % | 15 % |
| 100-24 | 65 % | 5 % | 15 % | 15 % |
| Range | 5% to 90% | 0% to 90% | 1% to 95% | 0.5% to 50% |

THERMALLY CONDUCTIVE COMPOSITIONS FOR TARGETED HEAT DISSIPATION OF ELECTRONIC COMPONENTS

FIELD

The subject matter disclosed herein relates to computing systems, computing devices, and/or electronic components and, more particularly, relates to thermally conductive compositions for targeted heat dissipation of one or more electronic components.

DESCRIPTION OF THE RELATED ART

Exposure to heat is one of the primary factors leading to performance degradation and/or failure of an electronic component. Due to large power and space limitations for existing thermal management solutions, heat dissipation is still a significant challenge for many conventional computing systems/devices and/or electronic components.

BRIEF SUMMARY

Thermal spreaders for targeted heat dissipation of one or more electronic components are disclosed. One thermal spreader includes a thermally conductive composition configured to function in conjunction with an electrically insulator material to dissipate heat away from a heat-generating electronic component of a computing device while electrically insulating the electronic component. The thermally conductive composition is malleable to target placement of the thermally conductive material on the electrically insulator material such that the thermally conductive composition is in thermal communication with a targeted area of the electronic component over which the electrically insulator material is positioned for targeted heat dissipation of the electronic component.

Also disclosed are apparatus for targeted heat dissipation of one or more electronic components. One apparatus includes a heat-generating electronic component, an electrically insulator material covering at least a portion of the electronic component, and a thermally conductive composition positioned on the electrically insulator material. The thermally conductive composition is malleable to target placement of the thermally conductive material on the electrically insulator material such that the thermally conductive composition is in thermal communication with a targeted area of the electronic component over which the electrically insulator material is positioned for targeted heat dissipation of the electronic component while electrically insulating the electronic component.

Systems for targeted heat dissipation of one or more electronic components are further disclosed herein. One system includes a heat-generating first electronic component, a heat-generating second electronic component, an electrically insulator material covering at least a first portion of the first electronic component and at least a second portion of the second electronic component, a first thermally conductive composition positioned on the first portion of the electrically insulator material, and a second thermally conductive composition positioned on the second portion of the electrically insulator material. The first thermally conductive composition is malleable to target placement of the first thermally conductive material on the first portion of the electrically insulator material such that the first thermally conductive composition is in thermal communication with a first targeted area of the first electronic component over which the electrically insulator material is positioned for first targeted heat dissipation of the first electronic component while electrically insulating the first electronic component. Similarly, the second thermally conductive composition is malleable to target placement of the second thermally conductive material on the second portion of the electrically insulator material such that the second thermally conductive composition is in thermal communication with a second targeted area of the second electronic component over which the electrically insulator material is positioned for second targeted heat dissipation of the second electronic component while electrically insulating the second electronic component.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which:

FIGS. 1A through 1C are diagrams of various embodiments of a thermally conductive composition that can dissipate heat from one or more electronic components;

FIG. 2 is a Table 1 illustrating various embodiments of the thermally conductive compositions shown in FIGS. 1A through 1C;

FIG. 3 is a Table 2 illustrating the thermal conductivity and electrical conductivity of one embodiment of a thermally conductive composition shown in FIGS. 1A through 1C and Table 1 of FIG. 2;

FIG. 4 is a Table 3 illustrating various other embodiments of the thermally conductive compositions shown in FIGS. 1A through 1C;

DETAILED DESCRIPTION

Figure 5A:
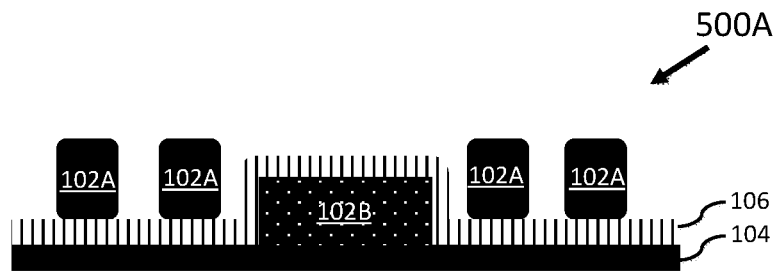
FIGS. 5A through 5D are schematic block diagrams of various examples of an apparatus and/or system including the thermally conductive compositions of FIGS. 1A through 1C, 2, and 3.

As will be appreciated by one skilled in the art, aspects of the various embodiments of a thermally conductive composition for targeted heat dissipation of one or more electronic components may be embodied as a liquid, gel, powder, a tape, or a paste. As used herein, the term, "heat dissipation,"

can mean heat transfer, heat removal, heat spreading, heat conduction, and/or heat homogenization, etc.

Further, the thermally conductive compositions may be implemented, placed, located, and/or positioned on a computing system, a computing apparatus/device, a computer program product, computer hardware, an electronic circuit, and/or an electronic component/device, etc., among other heat-generating electronic entities that are possible and contemplated herein. More specific examples (e.g., a non-exhaustive and/or non-limiting list) of heat-generating computing systems, computing apparatus/devices, computer program products, electronic circuits, and/or electronic components/devices, etc., would include, but are not limited to the following: a central processing unit (CPU), a graphics processing unit (GPU), a processor, a microprocessor, a power supply, a memory device (e.g., a portable computer diskette, a hard disk, a random-access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing), a motherboard, a printed circuit board (PCB), an input device, an output device, a graphics card, a computer chip, a microchip, an integrated circuit (IC), a computer/system bus, one or more circuit components (e.g., a capacitor, a resistor, a variable resistor, a voltage source, a current source, an inductor, a coil, an inverter, an amplifier, an operational amplifier, a switch, a transistor, a gate (e.g., an AND gate, NAND gate, OR gate, NOR gate, XOR gate, etc.) a diode, a light emitting diode (LED), a battery, a cell, a thermistor, a regulator, a potentiometer, a conductor, a wire, a fuse, a transformer, a lamp, a bulb, a motor, a buzzer, and/or an electrical connection including one or more wires, etc. among other heat-generating electronic components that are possible and contemplated herein. Accordingly, the various embodiments of a thermally conductive composition can be utilized for heat dissipation, heat transfer, heat removal, heat spreading, heat conduction, and/or heat homogenization, etc. for any suitable computing systems/device, computing hardware, electronic systems/devices, and/or circuit systems/devices, that may all generally, individually, and/or collectively, be referred to herein as an "electronic component."

Reference throughout this specification to one embodiment, an embodiment, or similar language means that a particular feature, structure, or characteristic described in connection with the embodiment is included in at least one embodiment. Thus, appearances of the phrases in one embodiment, in an embodiment, and similar language throughout this specification may, but do not necessarily, all refer to the same embodiment, but mean one or more but not all embodiments unless expressly specified otherwise. The terms including, comprising, having, and variations thereof mean including but not limited to, unless expressly specified otherwise. An enumerated listing of items does not imply that any or all of the items are mutually exclusive, unless expressly specified otherwise. The terms, "a," "an," and "the," also refer to one or more unless expressly specified otherwise.

In addition, as used herein, the term, "set," can mean one or more, unless expressly specified otherwise. The term, "sets," can mean multiples of or a plurality of one or mores, ones or more, and/or ones or mores consistent with set theory, unless expressly specified otherwise.

Furthermore, the described features, structures, or characteristics of the embodiments may be combined in any suitable manner. In the following description, numerous specific details are provided, such as examples of hardware circuits, hardware chips, etc., to provide a thorough understanding of embodiments. One skilled in the relevant art will recognize, however, that embodiments may be practiced without one or more of the specific details, or with other components, materials, and so forth. In other instances, well-known structures, materials, or operations are not shown or described in detail to avoid obscuring aspects of an embodiment.

Aspects of the embodiments may be described below with reference to schematic flowchart diagrams and/or schematic block diagrams of methods, apparatus, systems, and program products according to embodiments. It will be understood that each block of the schematic flowchart diagrams and/or schematic block diagrams, and combinations of blocks in the schematic flowchart diagrams and/or schematic block diagrams, can be implemented by code. The code may be provided to a processor of a general-purpose computer, special-purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The schematic flowchart diagrams and/or schematic block diagrams in the Figures illustrate the architecture, functionality, and operation of possible implementations of apparatuses, systems, methods and program products according to various embodiments. In this regard, each block in the schematic flowchart diagrams and/or schematic block diagrams may represent a module, segment, or portion of code, which includes one or more executable instructions of the code for implementing the specified logical function(s) on hardware and/or software.

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and code.

The description of elements in each figure may refer to elements of proceeding figures. Like numbers refer to like elements in all figures, including alternate embodiments of like elements.

FIGS. 1A through 1C are diagrams of various embodiments of thermally conductive compositions 100A, 100B, and 100C for targeted heat dissipation of one or more electronic components 102 in various chemical states. Specifically, FIG. 1A shows a liquid thermally conductive composition 100A, FIG. 1B shows a gel, powder, and/or paste thermally conductive composition 100B, and FIG. 1C shows a tape thermally conductive composition 100C. The liquid thermally conductive composition 100A, the gel, powder, and/or paste thermally conductive composition 100B, and the tape thermally conductive composition 100C can simply be referred to individually, in various groups, or collectively as, thermally conductive composition(s) 100.

A thermally conductive composition 100 can include any suitable set of physical characteristics (e.g., consistency, plasticity, softness/firmness, resiliency, surface adhesion (adhesibility), modulus, abrasion resistibility, set time, dry time, density, floatability, viscosity, texture, permanency, and/or removability, etc.) that allows/enables the thermally conductive composition 100 to be placed/positioned on and/or removed from a targeted location on an electronic component 102. In various embodiments, the thermally conductive composition 100 may be permanently, semi-permanently (e.g., temporarily), or removably positioned on the electronic component 102, as discussed in greater detail elsewhere herein.

Various embodiments of the thermally conductive composition 100-1x (see, FIG. 2) can include, among other substances, a silicone, a Talc, one or more thermal conductive materials, one or more additives, and a wax, among other additional and/or alternative substances that are possible and contemplated herein. Here, the thermally conductive composition 100 may include any suitable quantities and/or percentages of the Polysiloxane, the Talc, the thermal conductive material(s), the additive(s), and/or the wax.

In various embodiments, the thermally conductive composition 100-1x including the silicone, the Talc, the thermal conductive material(s), the additive(s), and the wax is a permanent, conforming, and/or dry mask for one or more electronic components 102. Further, the quantity and/or percentage of the silicone, the Talc, the thermal conductive material(s), the additive(s), and/or the wax included in the thermally conductive composition 100-1x can be varied and/or modified so that the resulting thermally conductive composition 100-1x includes a particular and/or a desired set of one or more characteristics and/or properties (e.g., heat dissipation, consistency, plasticity, softness/firmness, resiliency, surface adhesion (adhesibility), modulus, abrasion resistibility, set time, dry time, density, floatability, viscosity, texture, permanency, and/or removability, etc.).

A silicone included in a thermally conductive composition 100-1x can be any suitable silicon that is known or developed in the future capable of facilitating one or more characteristics and/or properties (e.g., heat dissipation, consistency, plasticity, softness/firmness, resiliency, surface adhesion (adhesibility), modulus, abrasion resistibility, set time, dry time, density, floatability, viscosity, texture, permanency, and/or removability, etc.) of the thermally conductive composition 100-1x. In various embodiments, the silicone includes a Polysiloxane.

The Polysiloxane, in various embodiments, is a polymer including siloxane, among other polymers that are known or developed in the future that are possible and contemplated herein. In some embodiments, the Polysiloxane includes the chemical formula, $-R_2Si-O-SiR_2-$, among other silicones and/or Polysiloxanes that are known or developed in the future that are possible and contemplated herein. Here, R is an organic group that can include any suitable organic substance and/or group of organic substances. In various embodiments, the thermally conductive composition 100-1x includes about 5% to about 95% silicone and/or Polysiloxane, among other suitable quantities and/or percentages of silicone and/or Polysiloxane that are greater than about 95% or less than about 5% that are possible and contemplated herein.

In various embodiments, the Talc includes magnesium silicate. In certain embodiments, the Talc is a clay mineral including magnesium silicate, which can be a hydrated magnesium silicate, among other magnesium silicates that are possible and contemplated herein.

In some embodiments, the Talc includes the chemical formula, $Mg_3Si_4O_{10}(OH)_2$, among other magnesium silicates that are possible and contemplated herein. In various embodiments the thermally conductive composition 100 includes about 5% to about 95% Talc, among other suitable quantities and/or percentages of Talc that are greater than about 95% or less than about 5% that are possible and contemplated herein.

The thermal conductive material can be any suitable thermal conductive material and/or combination of thermal conductive materials that is/are known or developed in the future capable of facilitating one or more characteristics and/or properties (e.g., heat dissipation, consistency, plasticity, softness/firmness, resiliency, surface adhesion (adhesibility), modulus, abrasion resistibility, set time, dry time, density, floatability, viscosity, texture, permanency, and/or removability, etc.) of the thermally conductive composition 100-1x. In various embodiments the thermally conductive composition 100-1x includes about 1% to about 95% of the thermal conductive material(s), among other suitable quantities and/or percentages of the thermal conductive material(s) that are greater than about 95% or less than about 1% that are possible and contemplated herein.

In various embodiments, the thermal conductive material(s) may include, but is/are not limited to, boron nitride, ceramic, diamond, graphite, glass, mica, granite, silicon carbide, beryllium oxide, aluminum, tungsten, silver, copper, gold, platinum, zinc, etc., and/or combinations thereof, among other thermal conductive materials and combinations of conductive materials that are possible and contemplated herein. In certain embodiments, the thermal conductive material(s) include(s) boron nitride (e.g., HEX-0.5 μm boron nitride, among other boron nitrides that are possible and contemplated herein).

The additive(s) may be any suitable additives that enable and/or allow a thermally conductive composition 100-1x to dissipate heat. In some embodiments, the thermally conductive composition 100-1x includes one additive. In additional or alternative embodiments, the thermally conductive composition 100-1x includes two different additives. In further additional or alternative embodiments, the thermally conductive composition 100-1x includes three or more different additives.

In various embodiments, one additive can include a Methyltris (Methylethylketoxim) Silane, which can be simply referred to as, Methyltris Silane, among other known or developed additives that are possible and contemplated herein. The Methyltris Silane can be utilized to act as a silane crosslinker to bond two or more polymer chains included in the thermally conductive composition 100-1x.

In some embodiments, the Methyltris Silane includes the chemical formula, $C_{13}H_{27}N_3O_3Si$, among other silanes that are possible and contemplated herein. In various embodiments the thermally conductive composition 100-1x includes about 0.5% to about 10% Methyltris Silane, among other suitable quantities and/or percentages of Methyltris Silane that are greater than about 10% or less than about 0.5% that are possible and contemplated herein.

In additional or alternative embodiments, an additive includes a 3-aminopropyl Triethoxysilane, among other additives that are known or developed in the future that are possible and contemplated herein. In some embodiments, the 3-aminopropyl Triethoxysilane includes the chemical formula, $C_9H_{23}NO_3Si$, among other known or developed silanes that are possible and contemplated herein. In various embodiments the thermally conductive composition 100-1$x$ includes about 0.5% to about 10% 3-aminopropyl Triethoxysilane, among other suitable quantities and/or percentages of 3-aminopropyl Triethoxysilane that are greater than about 10% or less than about 0.5% that are possible and contemplated herein.

A wax in the thermally conductive composition 100-1$x$ may include any suitable wax, combination of waxes, or combination of one or more waxes and one or more additional substances that is/are known or developed in the future capable of facilitating one or more characteristics and/or properties (e.g., heat dissipation, consistency, plasticity, softness/firmness, resiliency, surface adhesion (adhesibility), modulus, abrasion resistibility, set time, dry time, density, floatability, viscosity, texture, permanency, and/or removability, etc.) of the thermally conductive composition 100-1$x$. In various embodiments, the thermally conductive composition 100-1$x$ includes up to 5% wax, among other quantities and/or percentages of wax that are greater than about 5% that are possible and contemplated herein.

With reference to FIG. 2, FIG. 2 is a Table 1 illustrating various embodiments of a thermally conductive composition 100-1$x$. In Table 1, four non-limiting examples of a thermally conductive composition 100-1$x$ are shown (e.g., thermally conductive compositions 100-11, 100-12, 100-13, and 100-14).

At least in the illustrated embodiments, the thermally conductive compositions 100-11, 100-12, 100-13, and 100-14 each includes a silicone (Polysiloxane), a Talc, one or more thermal conductive material(s), two additives (Methyltris Silane and 3-aminopropyl Triethoxysilane), and a wax. While the thermally conductive compositions 100-11, 100-12, 100-13, and 100-14 are shown as including particular substances and/or particular quantities/percentages of each substance, the various embodiments of the thermally conductive composition 100 and/or 100-1$x$ are not limited to the example thermally conductive compositions 100-11, 100-12, 100-13, and 100-14 shown in Table 1. That is, various other embodiments of a thermally conductive composition 100 and/or 100-1$x$ may include one or more different substances, may exclude one or more substances, may include about or approximately the stated/indicated percentage(s), and/or may include one or more substances including a different quantity/percentage than the substance(s) included in the example thermally conductive compositions 100-11, 100-12, 100-13, and 100-14.

As illustrated on Table 1, the thermally conductive composition 100-11 includes 25% silicone (Polysiloxane), 35% Talc, 35% thermal conductive material(s), 1% to 3% Methyltris Silane, 1% to 3% 3-aminopropyl Triethoxysilane), and 2% wax, among other suitable quantities of the silicone (Polysiloxane), Talc, thermal conductive material(s), Methyltris Silane, 3-aminopropyl Triethoxysilane, and/or wax that are possible and contemplated herein. The thermally conductive composition 100-12 includes 45% silicone (Polysiloxane), 25% Talc, 25% thermal conductive material(s), 1% to 3% Methyltris Silane, 1% to 3% 3-aminopropyl Triethoxysilane), and 2% wax, among other suitable quantities of the silicone (Polysiloxane), Talc, thermal conductive material(s), Methyltris Silane, 3-aminopropyl Triethoxysilane, and/or wax that are possible and contemplated herein. The thermally conductive composition 100-13 includes 55% silicone (Polysiloxane), 25% Talc, 15% thermal conductive material(s), 1% to 3% Methyltris Silane, 1% to 3% 3-aminopropyl Triethoxysilane), and 2% wax, among other suitable quantities of the silicone (Polysiloxane), Talc, thermal conductive material(s), Methyltris Silane, 3-aminopropyl Triethoxysilane, and/or wax that are possible and contemplated herein. The thermally conductive composition 100-14 includes 65% silicone (Polysiloxane), 20% Talc, 5% thermal conductive material(s), 1% to 3% Methyltris Silane, 1% to 3% 3-aminopropyl Triethoxysilane), and 2% wax, among other suitable quantities of the silicone (Polysiloxane), Talc, thermal conductive material(s), Methyltris Silane, 3-aminopropyl Triethoxysilane, and/or wax that are possible and contemplated herein.

FIG. 3 is a Table 2 illustrating example thermal and electrical conductivities at various temperatures for the example thermally conductive composition 100-11 shown Table 1 of FIG. 2. That is, Table 2 shows the thermal and electrical conductivities at 0° C., 25° C., 35° C., 40° C., and 55° C. for the example thermally conductive composition 100-11. Specifically, the example thermally conductive composition 100-11 includes a thermo-conductivity of 6.3 W/mK and a resistivity of $>10^{13}\Omega$ at 0° C., a thermo-conductivity of 9.5 W/mK and a resistivity of $>10^{13}\Omega$ at 25° C., a thermo-conductivity of 11.2 W/mK and a resistivity of $>10^{13}\Omega$ at 35° C., a thermo-conductivity of 11.5 W/mK and a resistivity of $>10^{13}\Omega$ at 40° C., and a thermo-conductivity of 15.2 W/mK and a resistivity of $>10^{13}\Omega$ at 55° C.

Other embodiments of a thermally conductive composition 100-1$x$ (and/or a thermally conductive composition 100-2$x$ (see, Table 3 in FIG. 4) and/or a thermally conductive composition 100) may include different thermal and/or electrical conductivities at the same and/or different temperatures. Accordingly, a thermally conductive composition 100-1$x$ can include different quantities and/or percentages of the silicone, Talc, Boron Nitride, one or more additives, and/or wax can be varied and/or modified so that the resulting thermally conductive composition 100-1$x$ includes a particular and/or a desired set of thermo-conductivity and/or resistivity characteristics and/or properties.

Various embodiments of another thermally conductive composition 100-2$x$ (see, FIG. 4) can include, among other substances, a rubber, a Silica Talc, one or more thermal conductive materials, and a wax, among other additional and/or alternative substances that are possible and contemplated herein. Here, the thermally conductive composition 100-2$x$ may include any suitable quantities and/or percentages of the rubber, the Silica Talc, the thermal conductive material(s), and/or the wax.

In various embodiments, the thermally conductive composition 100-2$x$ can be a conforming, flexible, and/or removable mask for one or more electronic components 102 and/or can form an over-molding for the electronic component(s) 102. Further, the quantity and/or percentage of the rubber, the Silica Talc, the thermal conductive material(s), and/or the wax included in the thermally conductive composition 100-2$x$ can be varied and/or modified so that the resulting thermally conductive composition 100-2$x$ includes a particular and/or a desired set of one or more characteristics and/or properties (e.g., heat dissipation, consistency, plasticity, softness/firmness, resiliency, surface adhesion (adhesibility), modulus, abrasion resistibility, set time, dry time, density, floatability, viscosity, texture, permanency, and/or removability, etc.).

A rubber included in a thermally conductive composition 100-2x can be any suitable rubber, combination of two or more rubbers, or combination of one or more rubbers and one or more other substances, which can include any suitable substance(s) that is known or developed in the future capable of facilitating one or more characteristics and/or properties (e.g., heat dissipation, consistency, plasticity, softness/firmness, resiliency, surface adhesion (adhesibility), modulus, abrasion resistibility, set time, dry time, density, floatability, viscosity, texture, permanency, and/or removability, etc.) of the thermally conductive composition 100-2x. In various embodiments, the thermally conductive composition 100-2x includes about 5% to about 90% rubber, among other suitable quantities and/or percentages of rubber that are greater than about 90% or less than about 5% that are possible and contemplated herein.

In various embodiments, the Silica Talc in the thermally conductive composition 100-2x includes a silicate, which can be any suitable silicate that is known or developed in the future. In some embodiments, the Silica Talc comprises silicon dioxide, which includes the chemical formula, $SiO_2$, among other silicates that are possible and contemplated herein. In various embodiments the thermally conductive composition 100 includes up to about 90% Silica Talc, among other suitable quantities and/or percentages of Silica Talc that are greater than about 90% that are possible and contemplated herein.

The thermal conductive material(s) in the thermally conductive composition 100-2x can be any suitable thermal conductive material or combination of thermal conductive materials that is/are known or developed in the future capable of facilitating one or more characteristics and/or properties (e.g., heat dissipation, consistency, plasticity, softness/firmness, resiliency, surface adhesion (adhesibility), modulus, abrasion resistibility, set time, dry time, density, floatability, viscosity, texture, permanency, and/or removability, etc.) of the thermally conductive composition 100-2x. In various embodiments the thermally conductive composition 100-2x includes about 1% to about 95% of the thermal conductive material(s), among other suitable quantities and/or percentages of the thermal conductive material(s) that are greater than about 95% or less than about 1% that are possible and contemplated herein.

In various embodiments, the thermal conductive material(s) may include, but is/are not limited to, boron nitride, ceramic, diamond, graphite, glass, mica, granite, silicon carbide, beryllium oxide, aluminum, tungsten, silver, copper, gold, platinum, zinc, etc., and/or combinations thereof, among other thermal conductive materials and combinations of conductive materials that are possible and contemplated herein. In certain embodiments, the thermal conductive material(s) include(s) boron nitride (e.g., HEX-0.5 μm boron nitride, among other boron nitrides that are possible and contemplated herein).

A wax in the thermally conductive composition 100-2x may include any suitable wax, combination of waxes, or combination of one or more waxes and one or more additional substances that is/are known or developed in the future capable of facilitating one or more characteristics and/or properties (e.g., heat dissipation, consistency, plasticity, softness/firmness, resiliency, surface adhesion (adhesibility), modulus, abrasion resistibility, set time, dry time, density, floatability, viscosity, texture, permanency, and/or removability, etc.) of the thermally conductive composition 100-2x. In various embodiments, the thermally conductive composition 100-2x includes about 0.5% to about 50% wax, among other quantities and/or percentages of wax that are greater than about 50% or less than about 0.5% that are possible and contemplated herein.

In some embodiments, the wax is comprised of and/or further includes one or more petroleum oils, which can be any suitable petroleum oil(s) that is/are known or developed in the future capable of facilitating one or more characteristics and/or properties (e.g., heat dissipation, consistency, plasticity, softness/firmness, resiliency, surface adhesion (adhesibility), modulus, abrasion resistibility, set time, dry time, density, floatability, viscosity, texture, permanency, and/or removability, etc.) of the thermally conductive composition 100-2x. In certain embodiments, the one or more petroleum oils can include, for example, Paraffinic and/or Naphthenic, among other petroleum oils that are possible and contemplated herein.

With reference to FIG. 4, FIG. 4 is a Table 3 illustrating various embodiments of a thermally conductive composition 100-2x. In Table 3, four non-limiting examples of a thermally conductive composition 100-2x are shown (e.g., thermally conductive compositions 100-21, 100-22, 100-23, and 100-24).

At least in the illustrated embodiments, the thermally conductive compositions 100-21, 100-22, 100-23, and 100-24 each includes a rubber, a Silica Talc, one or more thermal conductive materials, and a wax. While the thermally conductive compositions 100-21, 100-22, 100-23, and 100-24 are shown as including particular substances and/or particular quantities/percentages of each substance, the various embodiments of the thermally conductive composition 100 and/or 100-2x are not limited to the example thermally conductive compositions 100-21, 100-22, 100-23, and 100-24 shown in Table 3. That is, various other embodiments of a thermally conductive composition 100 and/or 100-2x may include one or more different substances, may exclude one or more substances, may include about or approximately the stated/indicated percentage(s), and/or may include one or more substances including a different quantity/percentage than the substance(s) included in the example thermally conductive compositions 100-21, 100-22, 100-23, and 100-24.

As illustrated on Table 3, the thermally conductive composition 100-21 includes 35% rubber, 5% Silica Talc, 45% thermal conductive material(s), and 15% wax, among other suitable quantities of rubber, Silica Talc, thermal conductive material(s), and/or wax that are possible and contemplated herein. The thermally conductive composition 100-22 includes 45% rubber, 5% Silica Talc, 35% thermal conductive material(s), and 15% wax, among other suitable quantities of the rubber, Silica Talc, thermal conductive material(s), and/or wax that are possible and contemplated herein. The thermally conductive composition 100-23 includes 55% rubber, 5% Silica Talc, 25% thermal conductive material(s), and 15% wax, among other suitable quantities of the rubber, Silica Talc, thermal conductive material(s), and/or wax that are possible and contemplated herein. The thermally conductive composition 100-24 includes 65% rubber, 5% Silica Talc, 15% thermal conductive material(s), and 15% wax, among other suitable quantities of the rubber, Silica Talc, thermal conductive material(s), and/or wax that are possible and contemplated herein.

The various embodiments of a thermally conductive composition 100-2x may include different thermal and/or electrical conductivities at the same and/or different temperatures. Accordingly, a thermally conductive composition 100-2x can include different quantities and/or percentages of the rubber, Silica Talc, thermal conductive material(s), and/or wax can be varied and/or modified so that the resulting thermally conductive composition 100-2x includes a particular and/or a desired set of thermo-conductivity and/or resistivity characteristics and/or properties.

FIGS. 5A through 5D are schematic block diagrams of various examples of an apparatus/system 500A, 500B, 500C, and 500D (also simply referred to individually, in various groups, or collectively as, apparatus 500 and/or system(s) 500) that can include a thermally conductive composition 100, 100-1x, or 100-2x for targeted heat dissipation of one or more electronic components 102A and/or 102B. At least in the examples of FIGS. 5A through 5D, the electronic components 102A include a capacitor and the electronic component 102B includes a CPU, among other types and/or quantities of heat-generating components 102, as discussed elsewhere herein. That is, the various embodiments of an apparatus/system 500 are not limited to the examples illustrated in and discussed with reference to FIGS. 5A through 5D. In other words, an apparatus/system 500 can include any suitable type(s) and/or quantity/quantities of electronic components 102 and/or suitable type(s) and/or quantity/quantities of thermally conductive compositions 100, 100-1x, and/or 100-2x.

In FIG. 5A, the apparatus 500A (and/or system 500A) includes, among other components a set of electronic components 102A (e.g., four capacitors) and an electronic component 102B (e.g., a CPU) mounted on a substrate 104 (e.g., a PCB). The apparatus 500A also includes an insulator material 106 over the leads of the set of electronic components 102A (e.g., partially over the electronic components 102A) and over the electronic component 102B.

The insulator material 106 may include any suitable substance and/or combination of substances capable of electrically insulating an electronic component 102 while also providing at least some thermal conductivity. Examples of suitable insulator materials include, but are not limited to, wax, glass, rubber, quartz, cotton, plastic, etc., and/or combinations thereof, among other insulators and/or combinations of insulators that are possible and contemplated herein.

In certain embodiments, the insulator material 106 can function in conjunction with one or more thermally conductive compositions 100 for targeted heat dissipation of one or more electronic components 102, as discussed elsewhere herein. As shown in FIG. 5A, the insulator material 106 functions to electrically insulate the electronic components 102A and 102B from one another and also dissipates at least some of the heat generated by the electronic component 102B.

Figure 5B:
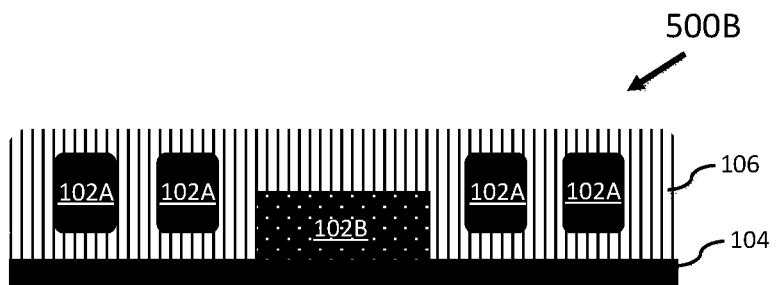

In FIG. 5B, the apparatus 500B (and/or system 500B) includes, among other components a set of electronic components 102A and an electronic component 102B mounted on a substrate 104 similar to the apparatus/system 500A. The apparatus 500B also includes an insulator material 106 over the set of electronic components 102A and the electronic component 102B. As shown in FIG. 5B, the insulator material 106 functions to electrically insulate the electronic components 102A and 102B from one another and also dissipates at least some of the heat generated by the electronic components 102A and 102B.

Figure 5C:
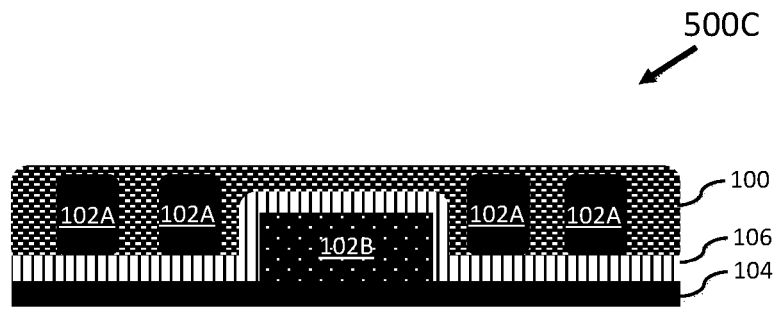

In FIG. 5C, the apparatus 500C (and/or system 500C) includes, among other components a set of electronic components 102A and an electronic component 102B mounted on a substrate 104 similar to the apparatus/systems 500A and 500B. The apparatus 500C also includes an insulator material 106 over the leads of the set of electronic components 102A (e.g., partially over the electronic components 102A) and over the electronic component 102B. The apparatus 500C further includes a thermally conductive composition 100 over the insulator material 106 that is partially over the set of electronic components 102A and over the electronic component 102B.

In the illustrated embodiment of the apparatus 500C, the insulator material 106 functions in conjunction with the thermally conductive composition 100 for targeted heat dissipation of the electronic components 102A and 102B. As shown in FIG. 5C, the insulator material 106 functions to electrically insulate the set of electronic components 102A and the electronic component 102B from one another and dissipates at least some of the heat generated by the electronic component 102B. Further, the thermally conductive composition 100 dissipates heat generated by the set of electronic components 102A and also provides a greater degree of heat dissipation from the electronic component 102B to provide a cooling mechanism (e.g., a passive cooling mechanism) for the electronic components 102A and 102B.

Figure 5D:
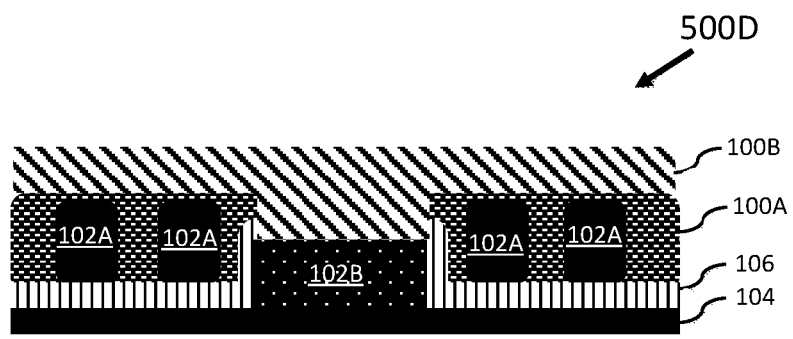

In FIG. 5D, the apparatus 500D (and/or system 500D) includes, among other components a set of electronic components 102A and an electronic component 102B mounted on a substrate 104 similar to the apparatus/systems 500A, 500B, and 500C. The apparatus 500D also includes an insulator material 106 partially over the set of electronic components 102A (e.g., the leads) and partially over the electronic component 102B (e.g., one or more sides of the electronic component 102B). The apparatus 500D further includes a thermally conductive composition 100A over the insulator material 106 that is over the set of electronic components 102A and the side(s) (portion(s)) of the electronic component 102B. An additional thermally conductive composition 100B is over a portion of the electronic component 102B (e.g., the top) and over the thermally conductive composition 100A, which is over the insulator material 106 that is over the set of electronic components 102A and the side(s) (portion(s)) of the electronic component 102B.

In some embodiments, the thermally conductive composition 100B includes a greater thermal conductivity than the thermally conductive composition 100A. In other embodiments, the thermally conductive composition 100A includes a greater thermal conductivity than the thermally conductive composition 100B. At least in the embodiment illustrated in FIG. 5D, the thermally conductive composition 100B includes a greater thermal conductivity than the thermally conductive composition 100A.

In the illustrated embodiment of the apparatus 500D, the insulator material 106 functions in conjunction with the thermally conductive compositions 100A and/or 100B for targeted heat dissipation of the electronic components 102A and 102B. As shown in FIG. 5D, the insulator material 106 functions to electrically insulate the electronic components 102A and 102B from one another and, in conjunction with the thermally conductive composition 100A, dissipates at least some of the heat generated by the electronic component 102B. The thermally conductive composition 100A also dissipates heat generated by the set of electronic components 102A since the thermally conductive composition 100A is in contact with and/or close proximity to the electronic components 102A. The thermally conductive material 100B dissipates the heat generated by the electronic component 102B since the thermally conductive composition 100B includes a greater thermal conductivity and is in contact with and/or close proximity to the electronic component 102B.

Accordingly, the positions/locations of the thermally conductive materials 100A and 100B can provide targeted thermal dissipation from the apparatus 500D so that the thermally conductive material 100B with the greater thermal conductivity can dissipate heat from an electronic component 102B (e.g., a CPU) that generates a larger amounts of heat while the thermally conductive material 100A with the smaller thermal conductivity can dissipate heat from an electronic component 102A (e.g., a capacitor, etc.) that generates a smaller amount of heat. Further, the thermally conductive material 100A and/or 100B, in conjunction with the insulator material 106, can provide heat dissipation from the electronic components 102A and 102B while also electrically insulating the electronic components 102A and 102B from one another.

FIGS. 6A through 6F are schematic block diagrams of various examples of thermal paths 600A, 600B, 600C, 600D, 600E, and 600F (also simply referred to individually, in various groups, or collectively as, path(s) 600) for dissipating heat from one or more electronic components 102 in a computing apparatus and/or system using one or more of the thermally conductive compositions 100, 100-1$x$, and 100-2$x$ and/or an insulator material 106.

Figure 6A:
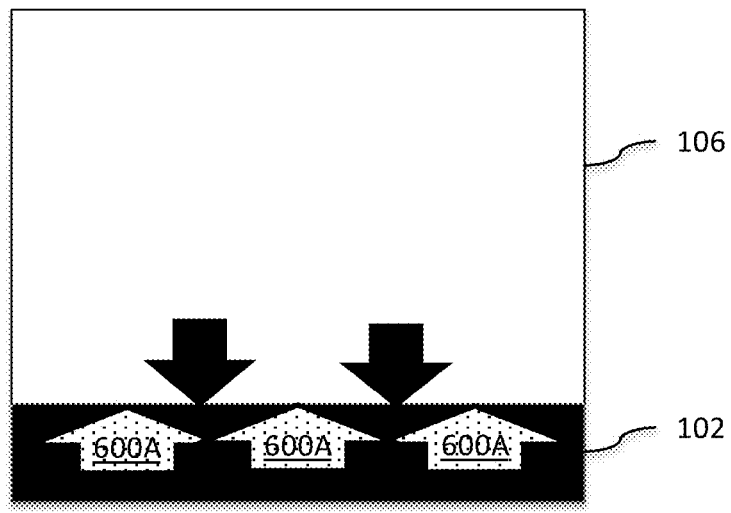
FIGS. 6A through 6F are schematic block diagrams of various examples of thermal paths in a computing apparatus and/or system including a set of one or more electronic components using the thermally conductive compositions of FIGS. 1A through 1C, 2, and 3 and/or an insulator material.

In FIG. 6A, the heat is dissipated from the electronic component 102 via the insulator material 106 along the thermal path 600A. The arrows representing the thermal path 600A are shaded to indicate that the insulator material 106 can enable and/or allow relatively small amounts of heat to dissipate from the electronic component 102. The insulator material 106 is configured to electrically insulate the electronic component 102 from one or more other electronic components 102 (not shown), as indicated by the black arrows directed toward the electronic component 102 from the insulator material 106.

Figure 6B:
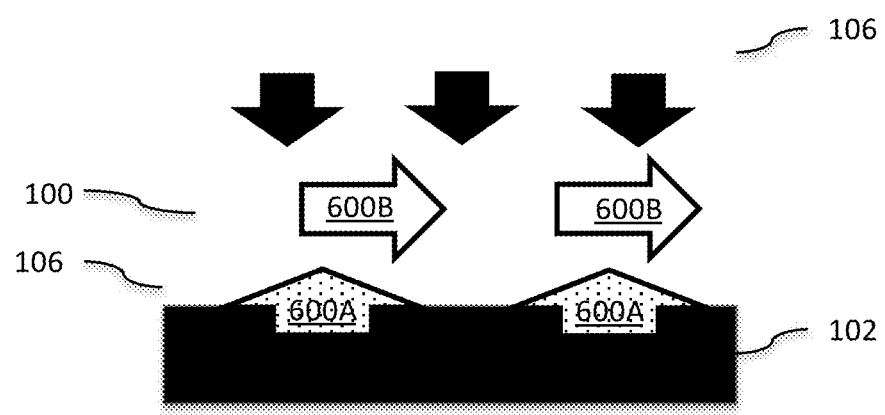

In FIG. 6B, heat is dissipated from the electronic component 102 via a thin layer of the insulator material 106 (e.g., along the shaded thermal path 600A) and via the thermally conductive composition 100 along the thermal path 600B. At least in the embodiment illustrated in FIG. 6B, the thermally conductive composition 100 is positioned on a portion of the insulator material 106 over the electronic component 102 so that the thermal path 600B includes a straight or relatively straight route for dissipating the heat generated by the electronic component 102.

The thermally conductive composition 100 can be varied and/or modified to include a predetermined and/or desired thermal conductivity so that the thermal path 600B can enable and/or allow a particular and/or sufficient amount of heat to dissipate from the electronic component 102 along the thermal path 600B. In addition, the thermally conductive composition 100 can be positioned on and/or proximate to the insulator material 106 over the electronic component 102 and in a manner that allows/enables the thermal path 600B to include a targeted and/or predetermined route away from the electronic component 102 and/or toward a predetermined and/or target destination.

The insulator material 106 over the thermally conductive composition 100 forming the thermal path 600B is configured to electrically insulate the electronic component 102 and/or the thermally conductive composition 100 from one or more other electronic components 102 (not shown), as indicated by the black arrows directed toward the thermally conductive composition 100 and the electronic component 102.

Figure 6C:
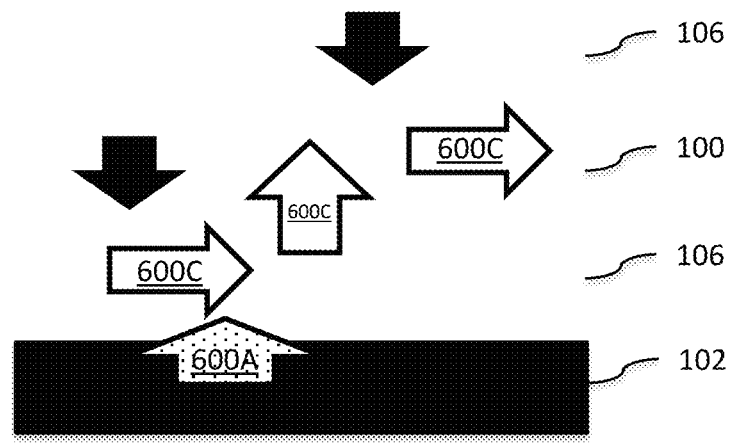

In FIG. 6C, heat is dissipated from the electronic component 102 via a thin layer of the insulator material 106 (e.g., along the shaded thermal path 600A) and via the thermally conductive composition 100 along the thermal path 600C. At least in the embodiment illustrated in FIG. 6C, the thermally conductive composition 100 is positioned on a thin layer of the insulator material 106 over a portion of the electronic component 102 and over a thicker layer of the insulator material 106 over another portion of the electronic component 102 so that the thermal path 600C includes a stepped shape or stepped route for dissipating the heat generated by the electronic component 102.

The thermally conductive composition 100 can be varied and/or modified to include a predetermined and/or desired thermal conductivity so that the thermal path 600C can enable and/or allow a particular and/or sufficient amount of heat to dissipate from the electronic component 102 along the thermal path 600C. In addition, the thermally conductive composition 100 can be positioned on and/or proximate to the insulator material 106 over the electronic component 102 and in a manner that allows/enables the thermal path 600C to include a targeted and/or predetermined route away from the electronic component 102 and/or toward a predetermined and/or target destination.

The insulator material 106 over the thermally conductive composition 100 forming the thermal path 600C is configured to electrically insulate the electronic component 102 and/or the thermally conductive composition 100 from one or more other electronic components 102 (not shown), as indicated by the black arrows directed toward the thermally conductive composition 100 and the electronic component 102.

Figure 6D:
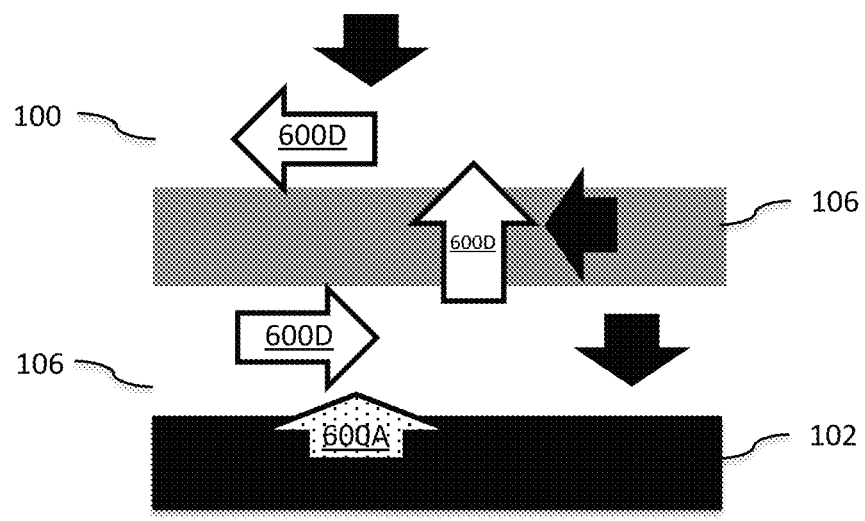

In FIG. 6D, heat is dissipated from the electronic component 102 via a thin layer of the insulator material 106 (e.g., along the shaded thermal path 600A) and via the thermally conductive composition 100 along the thermal path 600D. At least in the embodiment illustrated in FIG. 6D, the thermally conductive composition 100 is positioned on a thin layer of the insulator material 106 over a portion of the electronic component 102 and over a thicker layer of the insulator material 106 over the thermally conductive composition 100 so that the thermal path 600D includes a switchback shape or switchback route for dissipating the heat generated by the electronic component 102.

The thermally conductive composition 100 can be varied and/or modified to include a predetermined and/or desired thermal conductivity so that the thermal path 600D can enable and/or allow a particular and/or sufficient amount of heat to dissipate from the electronic component 102 along the thermal path 600D. In addition, the thermally conductive composition 100 can be positioned on and/or proximate to the insulator material 106 over the electronic component 102 and in a manner that allows/enables the thermal path 600D to include a targeted and/or predetermined route away from the electronic component 102 and/or toward a predetermined and/or target destination.

The insulator material 106 over the thermally conductive composition 100 forming the thermal path 600D is configured to electrically insulate the electronic component 102 and/or the thermally conductive composition 100 from one or more other electronic components 102 (not shown), as indicated by the black arrows directed toward the thermally conductive composition 100 and the electronic component 102.

Figure 6E:
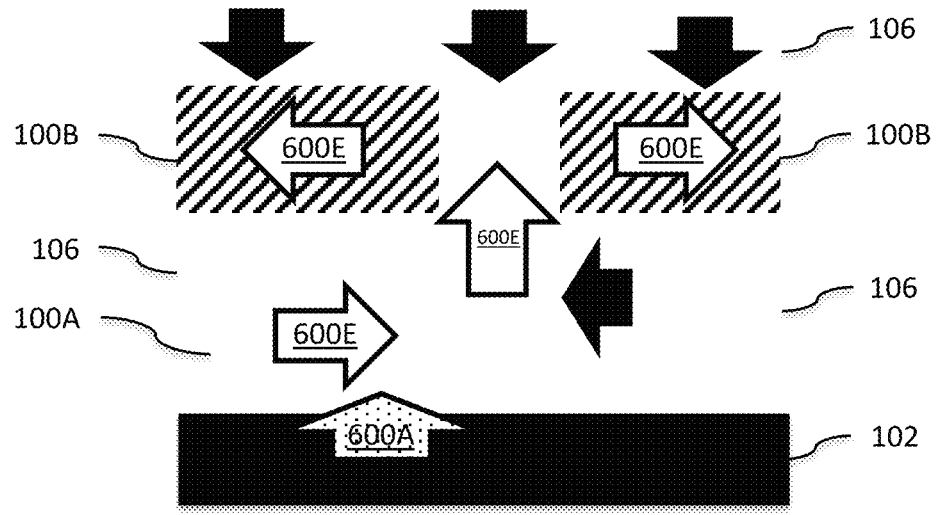

In FIG. 6E, heat is dissipated from the electronic component 102 via a thin layer of the insulator material 106 (e.g., along the shaded thermal path 600A) and via the thermally conductive compositions 100A and 100B along the thermal path 600E. At least in the embodiment illustrated in FIG. 6E, a thermally conductive composition 100A is positioned on a thin layer of the insulator material 106 over a portion of the electronic component 102 and forms reverse "L" shape or an "L" shape. In addition, another conductive composition 100B is positioned on the sides of the reverse "L" or "L"

shape near the top so that the thermal path 600E branches in at least two directions/routes for dissipating the heat generated by the electronic component 102.

In some embodiments, the thermally conductive composition 100B includes a greater thermal conductivity than the thermally conductive composition 100A. In other embodiments, the thermally conductive composition 100A includes a greater thermal conductivity than the thermally conductive composition 100B. At least in the embodiment illustrated in FIG. 6E, the thermally conductive composition 100B includes a greater thermal conductivity than the thermally conductive composition 100A and such a configuration may be beneficial in dissipating heat from an electronic component that generates large amounts of heat (e.g., a CPU, a GPU, etc.).

The thermally conductive composition 100A and/or 100B can be varied and/or modified to include a predetermined and/or desired thermal conductivity so that the thermal path 600E can enable and/or allow a particular and/or sufficient amount of heat to dissipate from the electronic component 102 along the thermal path 600E. In addition, the thermally conductive composition 100A and/or 100B can be positioned on and/or proximate to the insulator material 106 over the electronic component 102 and in a manner that allows/enables the thermal path 600E to include a targeted and/or predetermined route away from the electronic component 102 and/or toward a predetermined and/or target destination.

The insulator material 106 over the thermally conductive composition 100A and/or 100B forming the thermal path 600E is configured to electrically insulate the electronic component 102 and/or the thermally conductive composition 100A and/or 100B from one or more other electronic components 102 (not shown), as indicated by the black arrows directed toward the thermally conductive composition 100A, the thermally conductive composition 100B, and the electronic component 102.

Figure 6F:
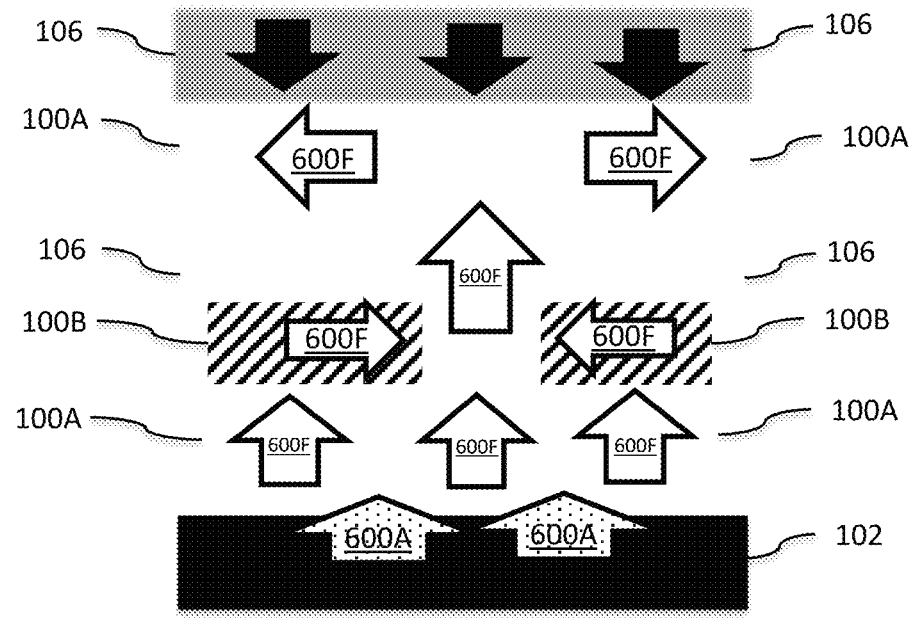

In FIG. 6F, heat is dissipated from the electronic component 102 via a thin layer of the insulator material 106 (e.g., along the shaded thermal path 600A) and via the thermally conductive compositions 100A and 100B along the thermal path 600F. At least in the embodiment illustrated in FIG. 6F, a thermally conductive composition 100A is positioned on a thin layer of the insulator material 106 over a portion of the electronic component 102 and forms an "I" shape. In addition, a layer of another conductive composition 100B is positioned above the bottom layer of the thermally conductive composition 100A on the sides of the "I" shape. A layer of the insulator material 106 is positioned under the top layer of the thermally conductive composition 100A and over the layer of another conductive composition 100B. In this embodiment, the thermal path 600F includes two bottom branches for obtaining heat from the electronic component 102 and two top branches for dissipating the heat generated by the electronic component 102 in at least two directions/routes. The intermediate layer of the conductive composition 100B can enhance the ability of the thermal path 600F in obtaining heat from the electronic component 102, concentrating the heat, and/or more rapidly dissipating the heat generated by the electronic component 102, among other benefits that are possible and contemplated herein.

In some embodiments, the thermally conductive composition 100B includes a greater thermal conductivity than the thermally conductive composition 100A. In other embodiments, the thermally conductive composition 100A includes a greater thermal conductivity than the thermally conductive composition 100B. The embodiment of a thermal path 600F illustrated in FIG. 6F may be beneficial in dissipating heat from an electronic component that generates large amounts of heat (e.g., a CPU, a GPU, etc.).

The thermally conductive composition 100A and/or 100B can be varied and/or modified to include a predetermined and/or desired thermal conductivity so that the thermal path 600F can enable and/or allow a particular and/or sufficient amount of heat to dissipate from the electronic component 102 along the thermal path 600F. In addition, the thermally conductive composition 100A and/or 100B can be positioned on and/or proximate to the insulator material 106 over the electronic component 102 and in a manner that allows/enables the thermal path 600F to include a targeted and/or predetermined route away from the electronic component 102 and/or toward a predetermined and/or target destination.

The insulator material 106 over the thermally conductive composition 100A and/or 100B forming the thermal path 600F is configured to electrically insulate the electronic component 102 and/or the thermally conductive composition 100A and/or 100B from one or more other electronic components 102 (not shown), as indicated by the black arrows directed toward the thermally conductive composition 100A, the thermally conductive composition 100B, and the electronic component 102.

While various specific embodiments of a thermal path 600 are illustrated in and discussed with reference to FIGS. 6A through 6F, the various embodiments of a thermal path 600 are not limited to such embodiments. That is, the various embodiments of a thermal path 600 may include a greater quantity of thermally conductive compositions 100, one or more different shapes capable of dissipating heat, and/or a greater quantity of routes for dissipating heat, etc., among other structures and/or characteristics that are possible and contemplated herein.

Figure 7:
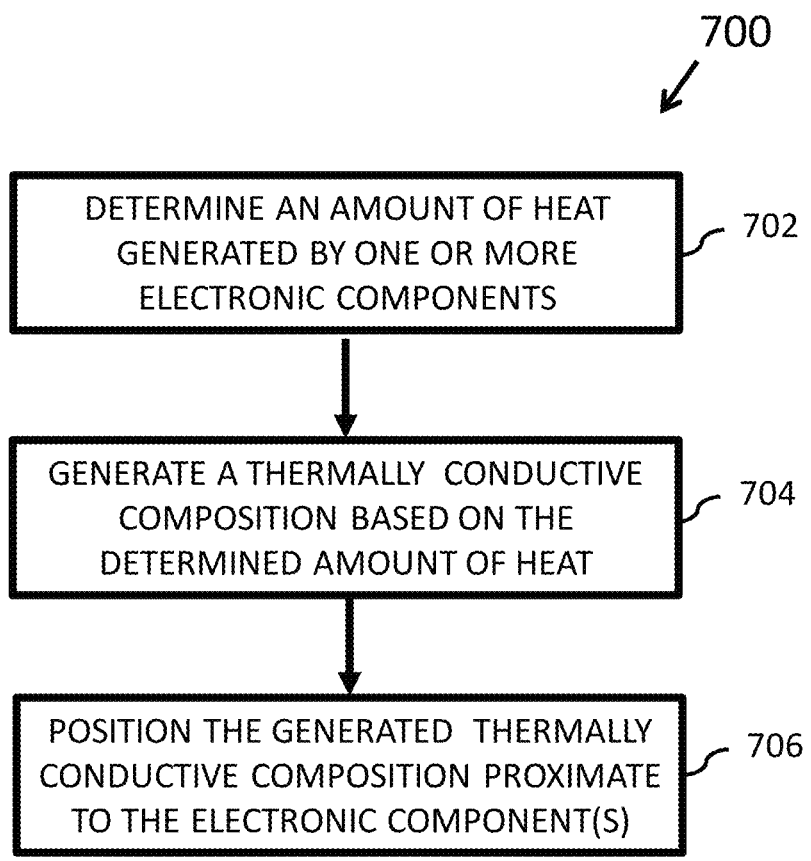
FIG. 7 is a schematic flow chart diagram illustrating one embodiment of a method for dissipating heat from one or more electronic components utilizing a thermally conductive composition.

FIG. 7 is a schematic flow chart diagram illustrating one embodiment of a method 700 for dissipating heat from one or more electronic components 102 utilizing a thermally conductive composition 100. At least in the illustrated embodiment, the method 700 begins by determining an amount of heat generated by the one or more electronic components (block 702).

The method 700 further includes generating a thermally conductive composition 100 based on the determined amount of heat generated by the electronic component(s) 102 (block 704). The thermally conductive composition 100 may include any of the embodiments of a thermally conductive composition 100, 100-1x, and of 100-2x discussed elsewhere herein with reference to FIGS. 1A through 4.

The thermally conductive composition 100 is then positioned on and/or proximate to the electronic component(s) 102 (block 706). In some embodiments, the thermally conductive composition 100 can positioned on a thin layer of an insulator material 106 so that the thermally conductive composition 100 and the insulator material 106 work in conjunction to dissipate the heat generated by the electronic component(s) 102 and electrically insulate the electronic component(s) 102.

Figure 8:
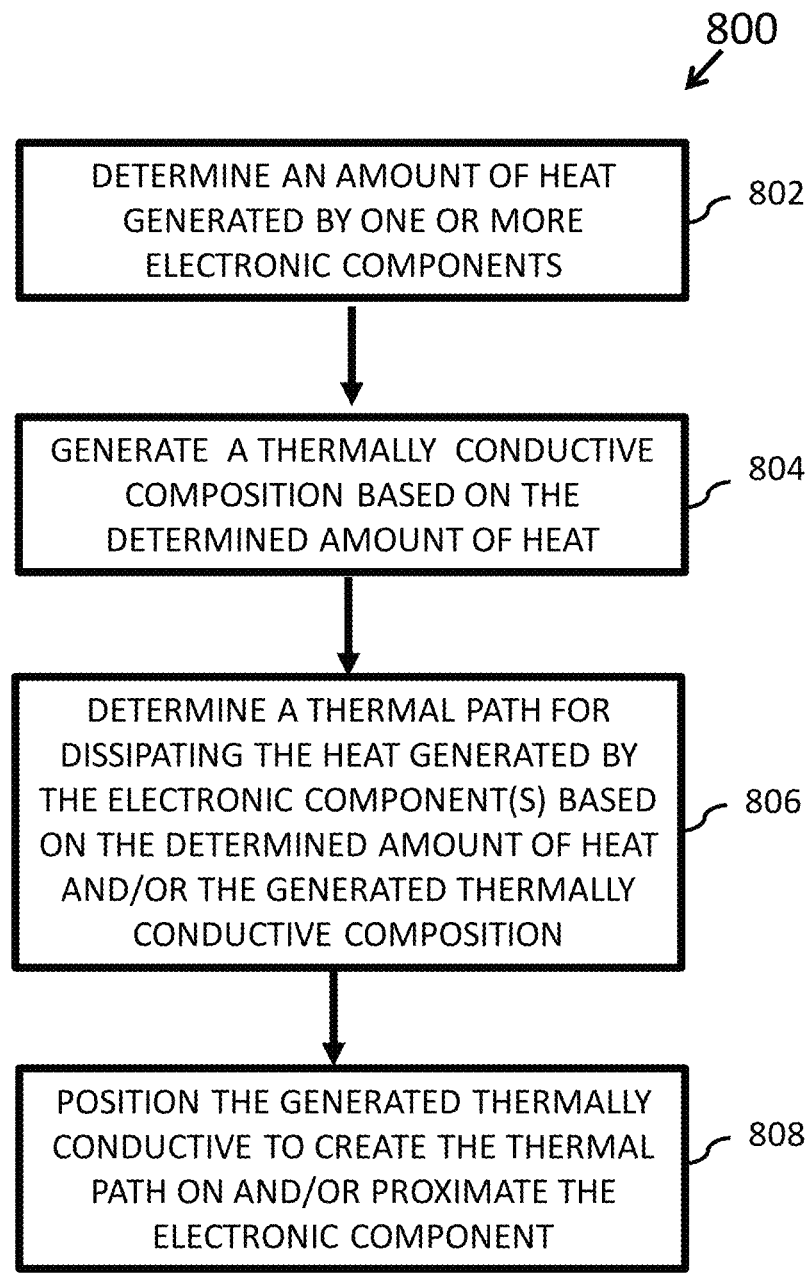
FIG. 8 is a schematic flow chart diagram illustrating one embodiment of a method for generating a thermal path including a thermally conductive composition to dissipate heat from one or more electronic components.

FIG. 8 is a schematic flow chart diagram illustrating one embodiment of a method 800 for generating a thermal path 600 including a thermally conductive composition 100 to dissipate heat from one or more electronic components 102. At least in the illustrated embodiment, the method 800 begins by determining an amount of heat generated by the one or more electronic components (block 802).

The method 800 further includes generating a thermally conductive composition 100 based on the determined amount of heat generated by the electronic component(s) 102 (block 804). The thermally conductive composition 100 may include any of the embodiments of a thermally conductive composition 100, 100-1x, and of 100-2x discussed elsewhere herein with reference to FIGS. 1A through 4.

A thermal path 600 for dissipating the heat generated by the electronic component(s) 102 is determined based on the determined amount of heat generated by the electronic component(s) 102 and/or the generated thermally conductive composition 100 (block 806). The thermal path 600 may include any of the embodiments of a thermal path 600 discussed elsewhere herein with reference to FIGS. 6A through 6F.

The thermally conductive composition 100 is then positioned to generate the thermal path 600 on and/or proximate to the electronic component(s) 102 (block 808). In some embodiments, the thermally conductive composition 100 can positioned to generate the thermal path 600 on a thin layer of an insulator material 106 so that the thermally conductive composition 100 and the insulator material 106 work in conjunction to dissipate the heat generated by the electronic component(s) 102 and electrically insulate the electronic component(s) 102.

Figure 9:
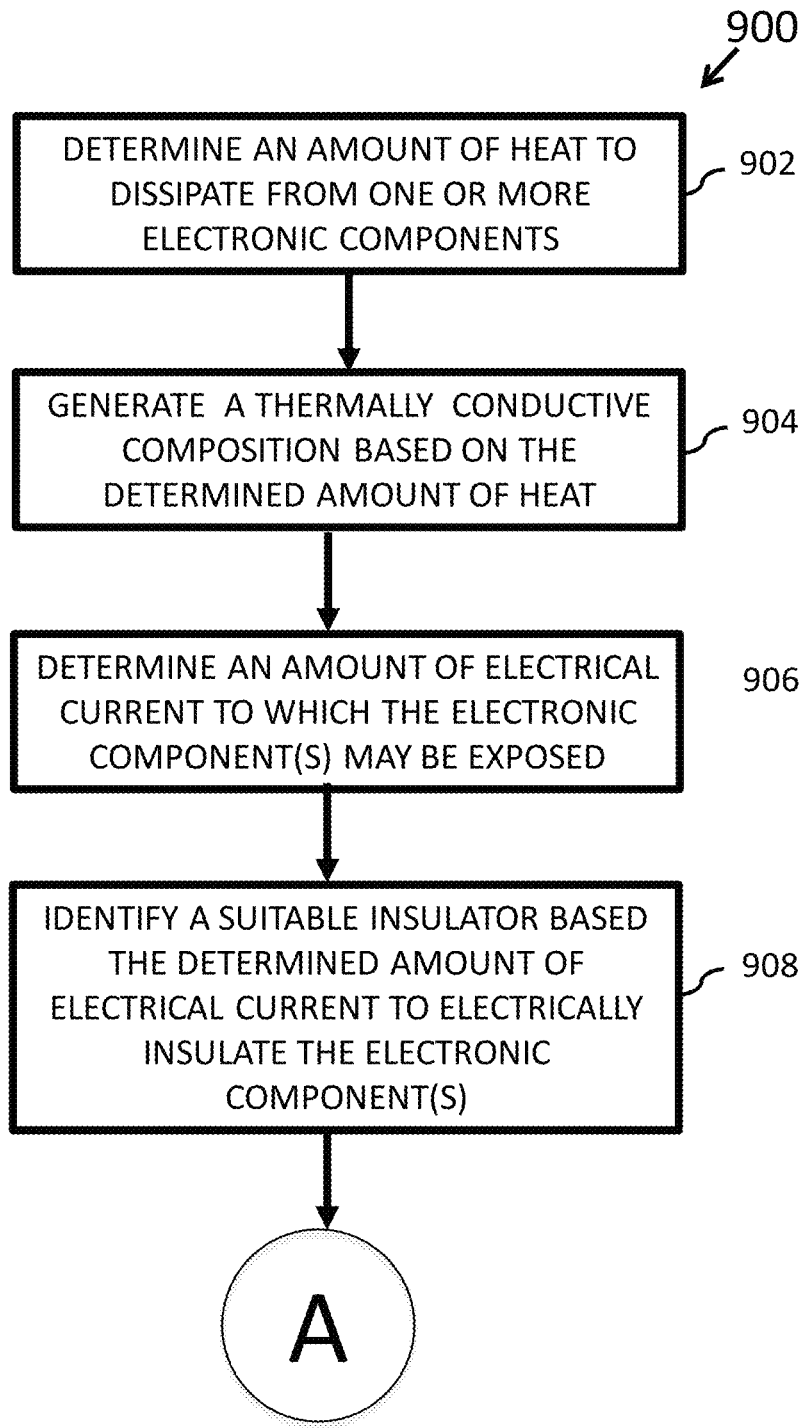
FIG. 9 is a schematic flow chart diagram illustrating another embodiment of a method for generating a thermal path including a thermally conductive composition to dissipate heat from one or more electronic components.
Figure 9:
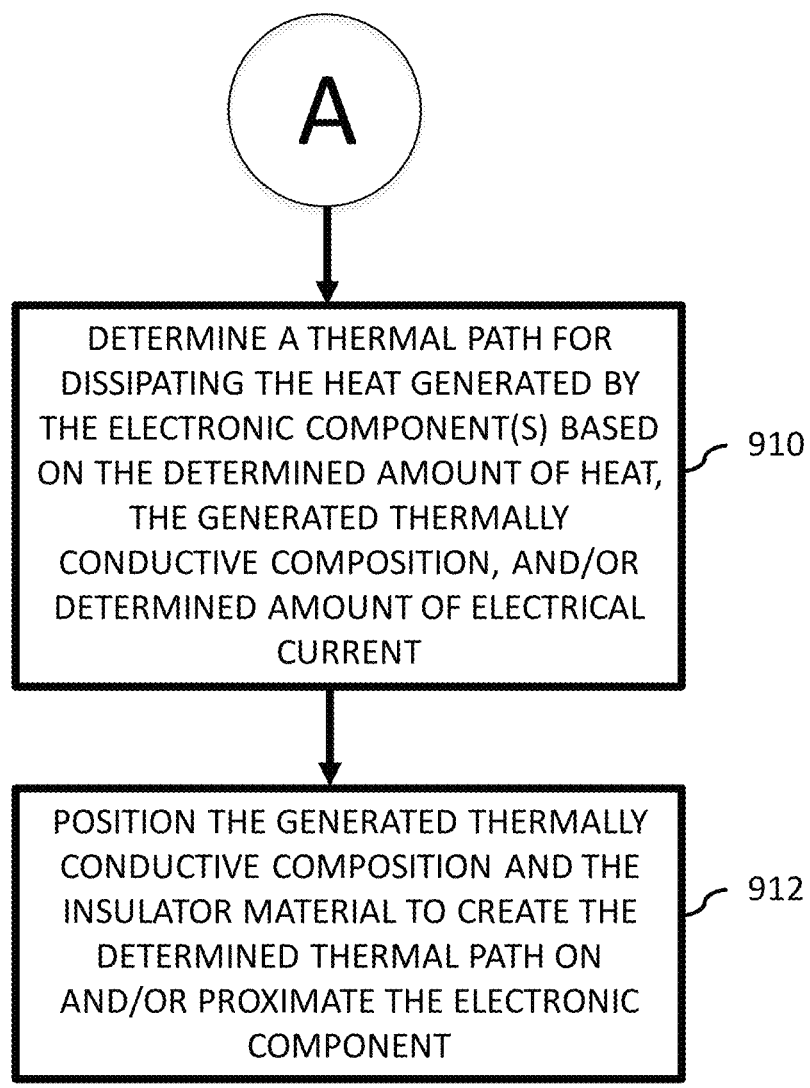

FIG. 9 is a schematic flow chart diagram illustrating another embodiment of a method 900 for generating a thermal path 600 including a thermally conductive composition 100 to dissipate heat from one or more electronic components 102. At least in the illustrated embodiment, the method 900 begins by determining an amount of heat generated by the one or more electronic components (block 902).

The method 900 further includes generating a thermally conductive composition 100 based on the determined amount of heat generated by the electronic component(s) 102 (block 904). The thermally conductive composition 100 may include any of the embodiments of a thermally conductive composition 100, 100-1x, and of 100-2x discussed elsewhere herein with reference to FIGS. 1A through 4.

Amount of electrical current that the electronic component(s) 102 may be exposed to is then determined (block 906). A suitable insulator material 106 is identified and/or determined based on the determined amount of electrical current to which the electronic component(s) 102 may be exposed to electrically insulate the electronic component(s) 102 (block 908).

A thermal path 600 for dissipating the heat generated by the electronic component(s) 102 is determined based on the determined amount of heat generated by the electronic component(s) 102, the generated thermally conductive composition 100, and/or the amount of determined electrical current to which the electronic component(s) 102 may be exposed (block 910). The thermal path 600 may include any of the embodiments of a thermal path 600 discussed elsewhere herein with reference to FIGS. 6A through 6F.

The thermally conductive composition 100 and the identified insulator material 106 are then positioned to generate the thermal path 600 on and/or proximate to the electronic component(s) 102 (block 912). In some embodiments, the thermally conductive composition 100 can positioned to generate the thermal path 600 on a thin layer of the insulator material 106 so that the thermally conductive composition 100 and the insulator material 106 work in conjunction to dissipate the heat generated by the electronic component(s) 102 and electrically insulate the electronic component(s) 102.

Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus, comprising:
a heat-generating electronic component;
an electrically insulator material covering at least a portion of the electronic component; and
a thermally conductive composition positioned on the electrically insulator material,
wherein:
the thermally conductive composition is malleable to target placement of the thermally conductive material on the electrically insulator material such that the thermally conductive composition is in thermal communication with a targeted area of the electronic component over which the electrically insulator material is positioned for targeted heat dissipation of the electronic component while electrically insulating the electronic component; and
the thermally conductive composition comprises a Polysiloxane, a Talc, a thermal conductive material, a Methyltris Silane, a 3-aminopropyl Triethoxysilane, and a wax.

2. The apparatus of claim 1, wherein the thermally conductive composition forms one of a permanent mask or a removable mask.

3. The apparatus of claim 1, wherein the thermally conductive composition comprises one of a liquid, a gel, a powder, a tape, or a paste.

4. The apparatus of claim 1, wherein:
the thermally conductive composition comprises 5%-95% Polysiloxane, 5%-95% Talc, 1%-55% thermal conductive material, 0.5%-10% Methyltris Silane, 0.5%-10% 3-aminopropyl Triethoxysilane, and up to 5% wax.

5. The apparatus of claim 4, wherein the thermally conductive composition comprises 25%-65% Polysiloxane.

6. The apparatus of claim 4, wherein the thermally conductive composition comprises 20%-35% talc.

7. The apparatus of claim 4, wherein the thermally conductive composition comprises 5%-35% thermal conductive material.

8. A system, comprising:
a heat-generating first electronic component;
a heat-generating second electronic component;
an electrically insulator material covering at least a first portion of the first electronic component and at least a second portion of the second electronic component;
a first thermally conductive composition positioned on the first portion of the electrically insulator material; and
a second thermally conductive composition positioned on the second portion of the electrically insulator material,
wherein:
the first thermally conductive composition is malleable to target placement of the first thermally conductive material on the first portion of the electrically insulator material such that the first thermally conductive composition is in thermal communication with a first targeted area of the first electronic component over which the electrically insulator material is positioned for first targeted heat dissipation of the first electronic component while electrically insulating the first electronic component,
the second thermally conductive composition is malleable to target placement of the second thermally conductive material on the second portion of the electrically insulator material such that the second thermally conductive composition is in thermal communication with a second targeted area of the second electronic component over which the electrically insulator material is positioned for second targeted heat dissipation of the second electronic component while electrically insulating the second electronic component, and at least one of the first thermally conductive composition and the second thermally conductive composition comprises a Polysiloxane, a Talc, a thermal conductive material, a Methyltris Silane, a 3-aminopropyl Triethoxysilane, and a wax.

9. The system of claim 8, wherein:
the first thermally conductive composition is positioned on the electrically insulator material to create a first thermally conductive path to dissipate heat away from the first electronic component while electrically insulating the first electronic component;
the second thermally conductive composition is positioned on the electrically insulator material to create a second thermally conductive path to dissipate heat away from the second electronic component while electrically insulating the electronic component; and
the first thermally conductive composition and the second thermally conductive composition include one of:
  a same thermal conductivity such that the first thermally conductive path and the second thermally conductive path include the same thermal conductivity, and
  different thermal conductivities such that the first thermally conductive path and the second thermally conductive path include different thermal conductivities.

10. The system of claim 8, wherein:
the first thermally conductive composition and the second thermally conductive composition each comprises one of a liquid, a gel, a powder, a tape, or a paste;
the one of the liquid, the gel, the powder, the tape, or the paste for the first thermally conductive composition and the second thermally conductive composition are each one of a permanent mask or a removable mask; and
the first thermally conductive composition and the second thermally conductive composition comprise one or more of:
  different ones of the liquid, the gel, the powder, the tape, or the paste, or
  different ones of the permanent mask or the removable mask.

11. The system of claim 10, wherein:
the one of the liquid, the gel, the powder, the tape, or the paste for the first thermally conductive composition and the second thermally conductive composition are each one of a permanent mask or a removable mask.

12. The system of claim 10, wherein:
the first thermally conductive composition and the second thermally conductive composition comprise different ones of the liquid, the gel, the powder, the tape, or the paste.

13. The system of claim 8, wherein the other one of the first thermally conductive composition and the second thermally conductive composition comprises the Polysiloxane, the Talc, the thermal conductive material, the Methyltris Silane, the 3-aminopropyl Triethoxysilane, and the wax.

14. The system of claim 13, wherein:
the first thermally conductive composition and the second thermally conductive composition each comprise 5%-95% Polysiloxane, 5%-95% Talc, 1%-55% thermal conductive material, 0.5%-10% Methyltris Silane, 0.5%-10% 3-aminopropyl Triethoxysilane, and up to 5% wax.

15. The system of claim 14, wherein:
the first thermally conductive composition and the second thermally conductive composition comprise one of same percentages of the Polysiloxane or different percentages of the Polysiloxane.

16. The system of claim 14, wherein:
the first thermally conductive composition and the second thermally conductive composition comprise one of same percentages of the talc or different percentages of the talc.

17. The system of claim 14, wherein:
the first thermally conductive composition and the second thermally conductive composition comprise one of same percentages of the thermal conductive material or different percentages of the thermal conductive material.

18. The system of claim 14, wherein:
the first thermally conductive composition and the second thermally conductive composition comprise one of same percentages of the Methyltris Silane or different percentages of the Methyltris Silane.

19. The system of claim 14, wherein:
the first thermally conductive composition and the second thermally conductive composition comprise one of same percentages of the 3-aminopropyl Triethoxysilane or different percentages of the 3-aminopropyl Triethoxysilane.

20. The system of claim 14, wherein:
the first thermally conductive composition and the second thermally conductive composition comprise one of same percentages of the wax or different percentages of the wax.

* * * * *